(12) United States Patent
Miura et al.

(10) Patent No.: US 6,346,465 B1
(45) Date of Patent: Feb. 12, 2002

(54) SEMICONDUCTOR DEVICE WITH SILICIDE CONTACT STRUCTURE AND FABRICATION METHOD THEREOF

(75) Inventors: Yoshinao Miura; Koichi Ishida, both of Tokyo (JP)

(73) Assignee: NEC Corportion, Tokyo (JP)

( * ) Notice: Subject to any disclaimer, the term of this patent is extended or adjusted under 35 U.S.C. 154(b) by 0 days.

(21) Appl. No.: 09/598,502

(22) Filed: Jun. 22, 2000

Related U.S. Application Data (62) Division of application No. 09/102,642, filed on Jun. 23, 1998.

(30) Foreign Application Priority Data

Jun. 23, 1997 (JP) .............................................. 9-166087

(51) Int. Cl.$^7$ ............................................... H01L 21/22
(52) U.S. Cl. ........................ 438/542; 438/561; 438/682
(58) Field of Search ................................ 438/558, 559, 438/561, 682, 542

(56) References Cited

U.S. PATENT DOCUMENTS

| | | | |
|---|---|---|---|
| 4,707,197 A | | 11/1987 | Hensel et al. |
| 4,814,294 A | | 3/1989 | West et al. |
| 4,901,134 A | | 2/1990 | Misawa et al. |
| 5,323,053 A | | 6/1994 | Luryi et al. |
| 5,430,328 A | | 7/1995 | Hsue |
| 5,545,925 A | | 8/1996 | Hanaoka |
| 5,567,652 A | * | 10/1996 | Nishio ......................... 438/555 |
| 5,652,180 A | * | 7/1997 | Shinriki et al. .............. 438/620 |
| 5,710,438 A | | 1/1998 | Oda et al. |
| 5,818,092 A | | 10/1998 | Bai et al. |
| 5,973,372 A | | 10/1999 | Omid-Zohoor et al. |
| 6,229,167 B1 | * | 5/2001 | Ozawa ......................... 257/295 |

FOREIGN PATENT DOCUMENTS

| | | | |
|---|---|---|---|
| JP | 02162722 A | * | 6/1990 |
| JP | 10-335265 | | 12/1998 |

OTHER PUBLICATIONS

Wolf, S., Tauber R.N.; Silicon Processing for the VLSI Era Vol. 1: Process Technology, Lattice Press, Sunset Beach, CA, 1986, p.p. 191–194.*
T. Hosoya et al., "A Polycide Gate Electrode with a Conductive Diffusion Barrier Formed with ECR Nitrogen Plasma for Dual Gate CMOS", IEEE Transactions on Electron Devices, vol. 42, No. 12, Dec. 1995, pp. 2111–2116.
R.T. Tung, "Oxide Mediated Epitaxy of CoSi$_2$ on Silicon", Applied Physics Letters, vol. 68, No. 24, Jun. 10, 1996, pp. 3461–3463.
M.L.A. Dass et al., "Growth of Epitaxial CoSi$_2$ on (100) Si", Applied Physics Letters, vol. 58, No. 12, Mar. 25, 1991, pp. 1308–1310.

* cited by examiner

*Primary Examiner*—John F. Niebling
*Assistant Examiner*—Christopher Lattin
(74) *Attorney, Agent, or Firm*—Young & Thompson (57) ABSTRACT

A fabrication method of a semiconductor device that realizes a simplified contact formation process is provided. After a single-crystal silicon substrate having a main surface is provided, a dielectric film having a contact hole uncovering the main surface of the substrate is formed on the main surface of the substrate. Next, a silicon nitride film is formed on the main surface of the substrate in the contact hole of the dielectric film. Then, a metal film is formed on the dielectric film to be contacted with the silicon nitride film in the contact hole of the dielectric film. The metal film has a property that an atom of the metal film serves as diffusion species in a solid-phase silicidation reaction. The metal film, the silicon nitride film, the dielectric film, and the substrate are heat-treated to thereby form a metal silicide film due to a solid-phase silicidation reaction between the metal film and the substrate. The metal silicide film thus formed is contacted with the main surface of the substrate in the contact hole of the dielectric film. The metal silicide film has a single-crystal structure. Finally, an electrically conductive film is formed on the dielectric film to be electrically contacted with the main surface of the substrate through the metal silicide film in the contact hole of the dielectric film.

5 Claims, 6 Drawing Sheets

SEMICONDUCTOR DEVICE WITH SILICIDE CONTACT STRUCTURE AND FABRICATION METHOD THEREOF

CROSS-REFERENCE TO RELATED APPLICATIONS

This application is a division of copending application Ser. No. 09/102,642, filed Jun. 23, 1998.

BACKGROUND OF THE INVENTION

1. Field of the Invention

The present invention relates to a semiconductor device and more particularly, to a semiconductor device with a silicide contact structure and a fabrication method thereof.

2. Description of the Prior Art

In recent years, the need of making the contact junction shallower to suppress the short channel effects has been increasing more and more with the progressing integration level of electronic elements or components. Thus, it has been an essential problem to be solved to form a contact structure with an improved interface flatness and a more uniform crystal structure.

Also, to form a self-aligned contact structure, a silicide of a metal such as titanium (Ti) and cobalt (Co) has been used. However, in this case, the solid-phase silicidation reaction of these metals does not progress uniformly and as a result, needle-like metal crystals tend to be formed and the crystal structure of a diffusion region such as a source/drain region tends to be damaged. Thus, leakage current tends to flow through the contact structure.

Further, the metal silicide itself is easy to react with aluminum (Al) that is a main constituent of a metallic wiring line to be electrically connected to the contact structure. Especially, if the metal silicide contains a lot of crystal-grain boundaries, a barrier film needs to be additionally formed to withstand a subsequent fabrication process or processes necessitating the process temperature of 600° C. or higher.

One reason why the solid-phase silicidation reaction progresses non-uniformly is that various types of silicides having different compositions and crystal structures from one another are generated. For almost all metals that generate silicide, a silicon-poor silicide phase is generated at a comparatively low temperature of silicidation reaction due to comparatively low free energy. On the other hand, at a comparatively high temperature, the silicon-poor silicide phase is turned to a silicon-rich silicide phase with comparatively high heats of formation. Accordingly, a non-uniform silicide film tends to be generated in a heat treatment process of the fabrication process sequence for silicidation reaction dependent upon the crystalline nucleus density of the silicide crystals and the raising rate of the heat-treatment temperature.

As an example of uniform silicide films, an epitaxial cobalt silicide ($CoSi_2$) film is obtained by heat treating a cobalt film on a (111)-oriented surface of a single-crystal silicon (Si) substrate. The epitaxy of the $CoSi_2$ film is due to the fact that Si and $CoSi_2$ have approximately the same lattice constant and that the (111)-interface is energetically favorable. In the epitaxial film, crystal-grain boundaries scarcely exist and consequently, the crystal structure scarcely tends to vary due to heat treatment. This means that a highly reliable contact may be formed.

However, a (100)-oriented surface of a single-crystal silicon substrate has been usually used for semiconductor devices. In this case, a silicide phase such as the CoSi phase having a lower free energy tends to be generated at the start of a solid-phase silicidation reaction. Thus, a uniform epitaxial silicide film is difficult to be formed.

An improvement to solve this problem about non-uniformity is disclosed in an article, Applied Physics Letters, Vol. 58, pp. 1308, 1991. In this improvement, a titanium (Ti) film is additionally provided at the interface between a cobalt film and a single-crystal silicon substrate, thereby forming an epitaxial $CoSi_2$ film on a (100)-oriented surface of the Si substrate. However, in this case, there arises a problem that the epitaxial $CoSi_2$ film does not have a satisfactory thickness uniformity.

Another improvement to solve the above problem about non-uniformity is disclosed in an article, Applied Physics Letters, Vol.68, pp.3461, 1996. In this improvement, a silicon oxide ($SiO_x$) film is additionally provided at the interface between a cobalt film and a single-crystal silicon substrate, thereby forming an epitaxial $CoSi_2$ film on a (100)-oriented surface of the Si substrate. However, in this case, there arises a problem that the epitaxial $CoSi_2$ film does not have a satisfactory large thickness.

As described above, with the conventional formation method of a silicide contact structure where a metal film is directly deposited on a single-crystal silicon substrate and the metal film and the substrate are subjected to a heat treatment, a uniform silicide film is unable to be formed. Thus, it is difficult to form reliably a p-n junction with a small depth of 50 nm or less.

Moreover, because silicides are easy to react with aluminum (Al) that is a main constituent of a metallic wiring line to be electrically connected to the contact structure, a barrier film needs to be formed on the silicide film. This makes it complicated to form the contact structure.

SUMMARY OF THE INVENTION

Accordingly, an object of the present invention is to provide a semiconductor device having a reliable contact structure and a fabrication method thereof.

Another object of the present invention is to provide a semiconductor device having a reliable contact structure even if a p-n junction has a small depth of 50 nm or less and a fabrication method thereof.

Still another object of the present invention is to provide a semiconductor device in which a reliable contact structure is formed by simplified processes and a fabrication method thereof.

The above objects together with others not specifically mentioned will become clear to those skilled in the art from the following description.

According to a first aspect of the present invention, a semiconductor device is provided, which is comprised of a single-crystal silicon substrate having a main surface, a dielectric film formed on the main surface of the substrate and having a contact hole uncovering the main surface of the substrate, a metal silicide film contacted with the main surface of the substrate in the contact hole of the dielectric film, a silicon nitride film contacted with the metal silicide film in the contact hole of the dielectric film, and an electrically conductive film formed on the dielectric film and electrically connected with the main surface of the substrate through the metal silicide film and the silicon nitride film in the contact hole of the dielectric film.

The metal silicide film has a property that a metal atom of the metal silicide film serves as diffusion species in a solid-phase silicidation reaction for forming the metal silicide film.

With the semiconductor device according to the first aspect of the present invention, the silicon nitride film is formed to be contacted with the metal silicide film in the contact hole of the dielectric film, and the metal silicide film has a property that a metal atom of the metal silicide film serves as diffusion species in a solid-phase silicidation reaction for forming the metal silicide film.

Therefore, if a metal film for the metal silicide film is formed on the silicon nitride film and then, the metal film is subjected to a heat treatment for silicidation reaction, the atoms of the metal film diffuse into the main surface of the substrate through the silicon nitride film during a heat treatment for silicidation reaction, thereby forming the metal silicide film on the main surface of the substrate.

In this case, the atoms of the metal film are able to be suppressed from diffusing at the start of the heat treatment process for silicidation reaction. Thus, a silicide phase with the highest heat of formation is generated after the heat-treatment temperature is completely raised to a specific value. Accordingly, the silicon nitride film is left on the metal silicide film after the solid-phase silicidation reaction.

As a result, the crystal structure at the interface of the metal silicide film and the substrate is satisfactorily uniform and flat, which prevents leakage current from occurring at the interface between the metal silicide film and the substrate. This means that this semiconductor device has a reliable contact structure even if a p-n junction has a small depth of 50 nm or less.

Also, the silicon nitride film thus left serves as a barrier against the electrically conductive film formed on the silicon nitride film and consequently, this semiconductor device is fabricated by a simplified contact formation process.

In a preferred embodiment of the semiconductor device according to the first aspect of the present invention, the metal silicide film is a silicide of a metal selected from the group consisting of cobalt (Co), nickel (Ni), vanadium (V), platinum (Pt), and palladium (Pd). These metals have satisfactorily low heats of formation for nitrides and therefore, they scarcely react with the silicon nitride film. Thus, if the metal atoms diffuse by a diffusion length that corresponds to the film thickness of 10 nm or more, the structure of the silicon nitride film is kept unchanged.

Within these metals, Co is more preferred. In this case, there is an additional advantage that the metal silicide film has a single-crystal structure and a flatter interface.

In another preferred embodiment of the semiconductor device according to the first aspect of the present invention, the silicon nitride film has a thickness of 0.5 to 1.5 nm. If the thickness is less than 0.5 nm, the thickness of the silicon nitride film is difficult to be controlled. If the thickness is greater than 1.5 nm, the diffusion of the metal atoms is excessively slow and therefore, this film is not practically utilized.

A more preferred thickness of the silicon nitride film is 0.5 to 1.0 nm. If the thickness is equal to or less than 1.0 nm, a satisfactory diffusion rate of the metal atoms is obtained.

In still another preferred embodiment of the semiconductor device according to the first aspect of the present invention, the metal silicide film has a single-crystal structure. In this case, there is an additional advantage that the metal silicide film has a flatter interface.

According to a second aspect of the present invention, a fabrication method of a semiconductor device is provided, which is comprised of the following steps (a) to (f).

(a) A single-crystal silicon substrate having a main surface is provided.

(b) A dielectric film having a contact hole uncovering the main surface of the substrate is formed on the main surface of the substrate.

(c) A silicon nitride film is formed on the uncovered main surface of the substrate in the contact hole of the dielectric film.

(d) A metal film is formed on the dielectric film to be contacted with the silicon nitride film in the contact hole of the dielectric film.

The metal film has a property that an atom of the metal film serves as diffusion species in a solid-phase silicidation reaction.

(e) The metal film, the silicon nitride film, the dielectric film, and the substrate are heat-treated to thereby form a metal silicide film due to a solid-phase silicidation reaction between the metal film and the substrate.

The metal silicide film thus formed is contacted with the main surface of the substrate in the contact hole of the dielectric film.

The silicon nitride film is left on the metal silicide film thus formed.

(f) An electrically conductive film is formed on the dielectric film to be contacted with the silicon nitride film.

The electrically conductive film is electrically connected to the substrate through the silicon nitride film and the metal silicide film in the contact hole of the dielectric film.

With the fabrication method of a semiconductor device according to the second aspect of the present invention, after the silicon nitride film is formed on the main surface of the substrate in the contact hole of the dielectric film, the metal film is formed on the dielectric film to be contacted with the silicon nitride film in the contact hole of the dielectric film. The metal film has a property that an atom of the metal film serves as diffusion species in a solid-phase silicidation reaction.

Subsequently, the metal silicide film is formed by a heat treatment due to a solid-phase silicidation reaction between the metal film and substrate. The metal silicide film thus formed is contacted with the main surface of the substrate in the contact hole of the dielectric film. The silicon nitride film is left on the metal silicide film thus formed.

Accordingly, the atoms of the metal film are able to be suppressed from diffusing at the start of the heat treatment step (e) for silicidation reaction. Thus, a silicide phase with the highest free energy is generated after the heat-treatment temperature is completely raised to a specific value. Accordingly, the silicon nitride film is left on the metal silicide film after the solid-phase silicidation reaction.

As a result, a semiconductor device having a reliable contact structure is fabricated even if a p-n junction has a small depth of 50 nm or less.

Also, the silicon nitride film thus left on the metal silicide film serves as a barrier against the electrically conductive film formed on the dielectric film and consequently, this semiconductor device is fabricated by a simplified contact formation process even if a p-n junction has a small depth of 50 nm or less.

A preferred thickness of the silicon nitride film is 0.5 to 1.5 nm. If the thickness is less than 0.5 nm, the thickness of the silicon nitride film is difficult to be controlled. If the thickness is greater than 1.5 nm, the diffusion of the metal atoms is excessively slow and therefore, this film is not practically utilized.

A more preferred thickness of the silicon nitride film is 0.5 to 1.0 nm. If the thickness is equal to or less than 1.0 nm, a satisfactory diffusion rate of the metal atoms is obtained.

As the metal atoms, cobalt (Co), nickel (Ni), vanadium (V), platinum (Pt), and palladium (Pd) are preferably used.

These metals have satisfactorily low free energy for nitride and therefore, they scarcely react with silicon nitride. Thus, if the metal atoms diffuse by a diffusion length that corresponds to the film thickness of 10 nm or more, the structure of the silicon nitride film is kept unchanged.

When cobalt (Co) is used as the metal, a $CoSi_2$ film has an epitaxial structure with respect to the silicon substrate. This is because $CoSi_2$ has an approximately the same crystal structure and approximately the same lattice constant.

Also, the diffusion rate of Co within the silicon nitride film is extremely lower than that within a metal. Therefore, the $CoSi_2$ film becomes uniform in crystal structure and poor in defect compared with the conventional device where a Ti film is additionally provided between the substrate and a $SiN_x$ film.

In another preferred embodiment of the method according to the second aspect, a step of removing said silicon nitride film is added between the steps (e) and (f).

In this case, there is an additional advantage that the contact resistance is further lowered.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

First Embodiment

Figure 1A:
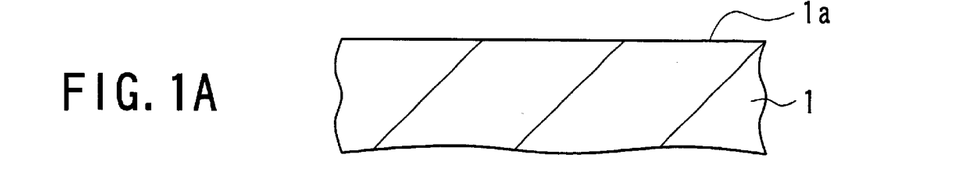
FIGS. 1A to 1E are partial cross-sections showing a fabrication method of a semiconductor device according to a first embodiment of the present invention, respectively.

First, a clean single-crystal silicon substrate 1 having a (100)-oriented main surface 1a is prepared, as shown in FIG. 1A.

Figure 1B:
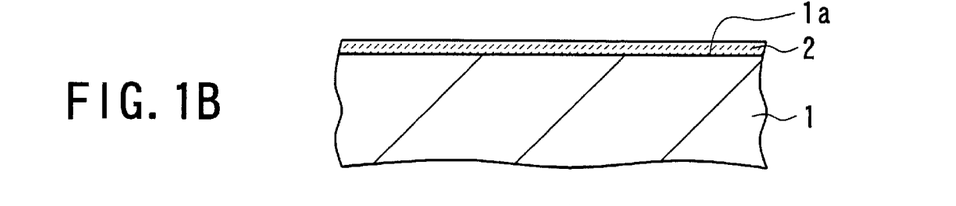

Next, the substrate 1 is transferred to a reaction chamber (not shown) of a plasma-enhanced Chemical Vapor Deposition (CVD) system. Then, plasma is generated in an ammonia atmosphere while keeping the temperature of the substrate 1 at 300°C. thereby directly nitriding the substrate 1 in the plasma. Thus, a silicon nitride ($SiN_x$) film 2 with a thickness of approximately 1 nm is formed on the main surface 1a of the substrate 1, as shown in FIG. 1B.

This $SiN_x$ film 2 thus formed has a composition close to the stoichiometric composition $Si_3N_4$, which can be confirmed by an X-ray photoelectron spectroscopy conducted by the inventors.

Figure 1C:
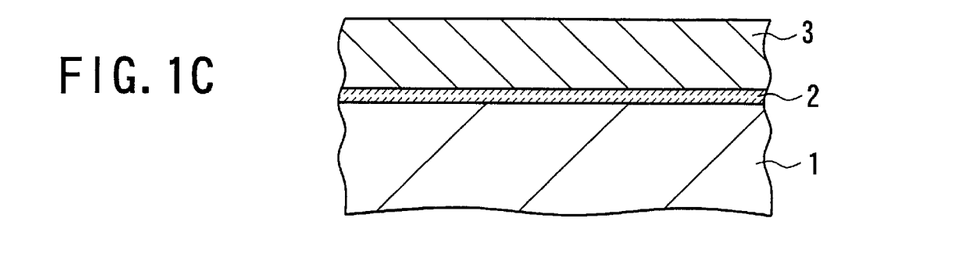

Subsequently, a Co film 3 with a thickness of 15 nm is deposited onto the $SiN_x$ film 2 by a sputtering process, as shown in FIG. 1C.

Figure 1D:
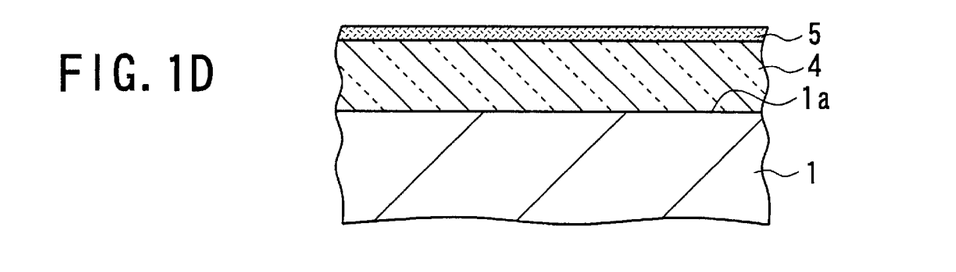

The substrate 1 with the Co film 3 and the $SiN_x$ film 2 is then subjected to a heat treatment process in an argon (Ar) atmosphere at 750° C. for 30 minutes. Thus, the Co film 3 is completely silicided to thereby form a cobalt silicide ($CoSi_2$) film 4 with a thickness of approximately 20 nm on the main surface 1a of the silicon substrate 1, as shown in FIG. 1D.

During this heat treatment process, the Co atoms in the Co film 3 diffused into the Si substrate 1 through the $SiN_x$ film 2. After this process, the $SiN_x$ film 2 is located on the $CoSi_2$ film 4, resulting in an amorphous film 5, as shown in FIG. 1D.

By observing the cross section of the $CoSi_2$ film 4 using a transmission electron microscope at a high resolution, the $CoSi_2$ film 4 is lattice-matched with the silicon substrate 1 and the orientation of the $CoSi_2$ film 4 is directed to (100). In other words, the $CoSi_2$ film 4 is epitaxial with the Si substrate 1.

The interface between the $CoSi_2$ film 4 and the silicon substrate 1 is flat in the level of one or two atomic layers, and the $CoSi_2$ film 4 has an approximately uniform thickness of approximately 20 nm.

The amorphous film 5 with a thickness of 1 to 2 nm located on the $CoSi_2$ film 4 is mainly made of a nitride of silicon, which was found by the inventors' analysis using a X-ray electron spectroscopy.

Figure 1E:
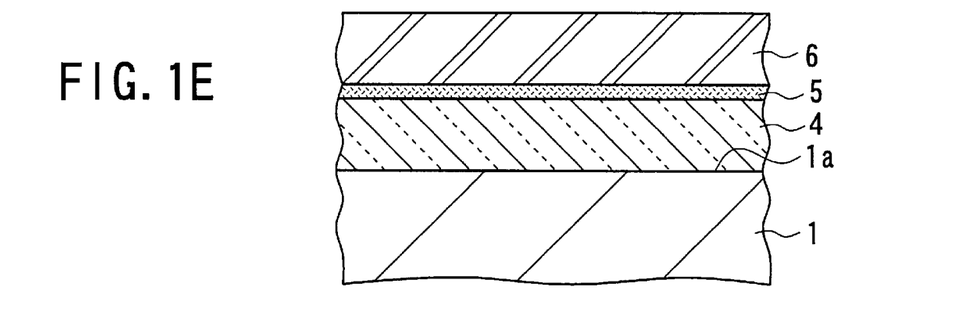

Following this heat-treatment process, an aluminum (Al) film 6 with a thickness of 50 nm is deposited on the amorphous $SiN_x$ film 5 by a sputtering process. The Si substrate 1 with the Al film 6, the amorphous $SiN_x$ film 5, and the $CoSi_2$ film 4 is subjected to a heat treatment process in an nitrogen ($N_2$) atmosphere at 550° C. for 60 minutes.

Through this heat treatment, the thickness of the interface between the Al film 6 and the amorphous $SiN_x$ film 5 is slightly increased. However, the flatness of the interface between the Al film 6 and the amorphous $SiN_x$ film 5 is kept unchanged. This means that the amorphous $SiN_x$ film 5 has a function to suppress the reaction at the interface between the Al film 6 and the amorphous $SiN_x$ film 5. This fact was confirmed by the inventors' test.

Additionally, when a silicide film of a metal such as titanium (Ti), tungsten (W), tantalum (Ta), and molybdenum (Mo) whose diffusion species in the solid-phase silicidation reaction is a Si atom is formed, even if the thin $SiN_x$ film 2 is formed between the Si substrate 1 and the metal film 3 and then, they are subjected to a heat treatment process, the silicide film of each of these metals is formed on the $SiN_x$ film 2. As a result, no good contact structure is obtained in this case.

Second Embodiment

FIGS. 2A to 2F show a fabrication method of a semiconductor device according to a second embodiment, in which a contact structure including a nickel silicide film is formed.

Figure 2A:
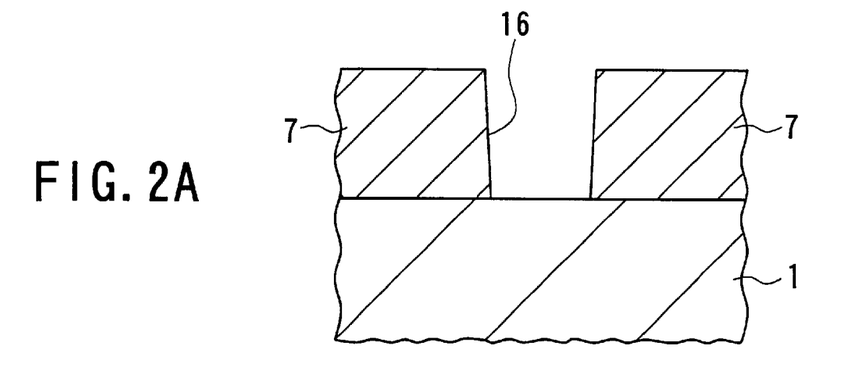
FIGS. 2A to 2F are partial cross-sections showing a fabrication method of a semiconductor device according to a second embodiment of the present invention, respectively.

First, after a single-crystal Si substrate 1 having a (100)-oriented main surface 1a is prepared, a silicon dioxide ($SiO_2$) film 7 with a thickness of 300 nm is formed on the main surface 1a. Then, a circular contact hole 16 with a diameter of 100 μm is formed in the $SiO_2$ film 7, as shown in FIG. 2A. The main surface 1a of the substrate 1 is exposed from the $SiO_2$ film 7 in the contact hole 16.

Figure 2B:
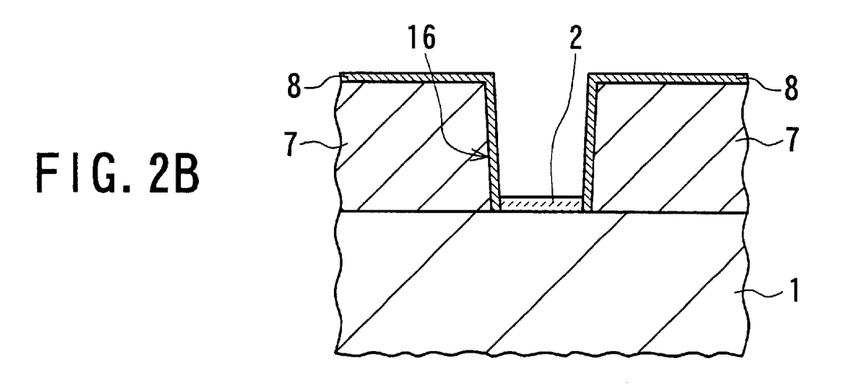

Next, after the substrate 1 with the $SiO_2$ film 7 is transferred to a vacuum chamber (not shown), a beam of a nitrogen ($N_2$) gas containing atomic nitrogen which has passed through a high-temperature filament is irradiated to the $SiO_2$ film 7 while keeping the temperature of the substrate 1 at 500 ° C. Thus, a silicon nitride film 2 with a thickness of 1.0 nm is formed on the exposed main surface 1a in the contact hole 16 and at the same time, a silicon oxynitride (SiON) film 8 is formed on the SiO$_2$ film 7, as shown in FIG. 2B.

The silicon nitride film 2 has a composition of SiN (i.e., Si:N=1:1), in which the nitrogen composition is less than the stoichiometeric composition Si$_3$N$_4$ (i.e., Si:N=3:4).

Figure 2C:
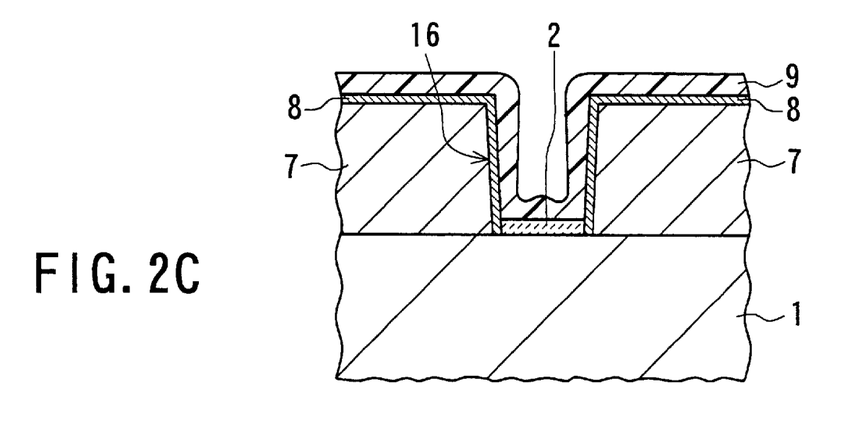

Subsequently, in the same vacuum chamber, the temperature of the substrate 1 is decreased to 50° C. and then, a nickel (Ni) film 9 with an average thickness of 20 nm is formed on the SiON film 8 using an electron beam (EB) gun, as shown in FIG. 2C.

Figure 2D:
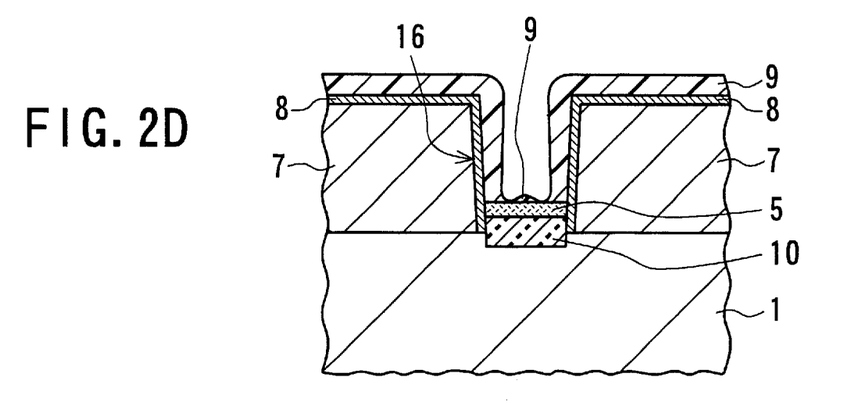

The substrate 1 with the Ni film 9, the SiON film 8, the SiO$_2$ film 7, and the SiN$_x$ film 2 is subjected to a Rapid Thermal Annealing (RTA) in an argon (Ar) atmosphere at 750° C. for 30 seconds, thereby causing a silicidation reaction between the Ni film 9 and the Si substrate 1. Thus, a nickel silicide (NiSi$_2$) film 10 with a uniform thickness of 30 nm is formed at the interface of the Si substrate 1 and the SiN$_x$ film 2 and at the same time, a film 5 containing silicon (Si) and nitrogen (N) as main constituents is formed on the NiSi$_2$ film 10, as shown in FIG. 2D. During this process, the Si atoms located just below the bottom of the contact hole 16 are consumed.

The NiSi$_2$ film 10 is directed to the (100) orientation corresponding to the (100)-oriented main surface 1a of the Si substrate 1. Also, since the lattice constant of NiSi$_2$ is approximately the same as that of Si, the NiSi$_2$/Si interface between the NiSi$_2$ film 10 and the Si substrate 1 is an epitaxial interface. Although the NiSi$_2$/Si interface includes some fascets of the (111) plane with a length of 1 to 2 nm, the NiSi$_2$/Si interface is flat and parallel to the (100) plane.

When the SiN film 2 is not provided prior to the silicidation reaction, the NiSi$_2$/Si interface is covered with the fascets or ledges along the (111) plane. Therefore, it was confirmed that the flat NiSi$_2$/Si interface is able to be realized due to the existence of the SiN film 2.

Figure 2E:
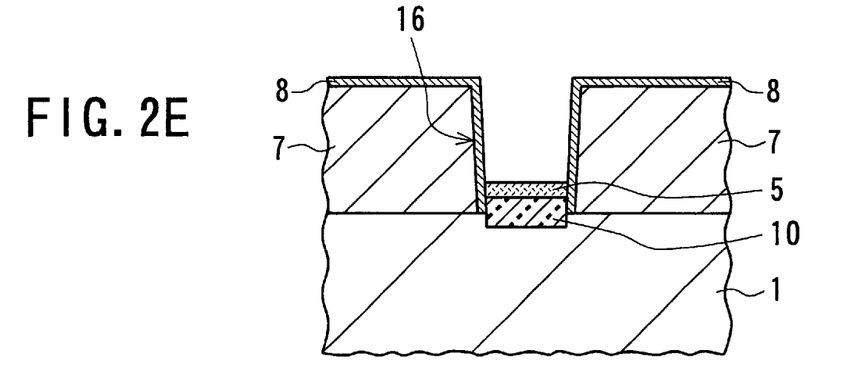

The Si substrate 1 with the NiSi$_2$ film 10 is then cleaned in an acid mixture solution containing hydrochloric acid (HCl) as its main constituent, thereby removing the unreacted Ni film 9 from the SiON film 8.

Figure 2F:
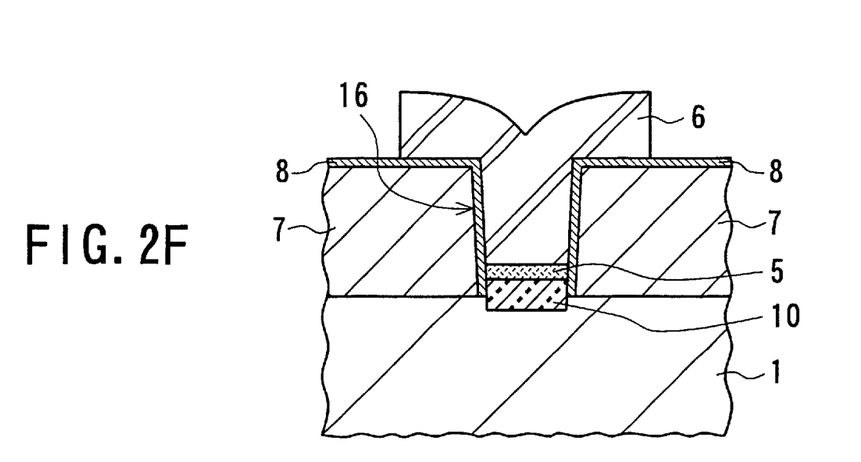

Following this cleaning process, an Al film 6 with a thickness of 200 nm is deposited on the SiON film 8 by a sputtering process and then, it is patterned to be a contact pad contacting with the amorphous SiN film 5 in the contact hole 16. Thus, the aluminum wiring film 6 is electrically connected to the Si substrate 1 through the amorphous SiN film 5 and the NiSi$_2$ film 10.

The contact structure thus formed constitutes a Schottky diode and the height of the electric potential barrier can be measured by the well-known I-V method. The inventor measured the height of the electric potential barrier at 77 K, and the result showed that 0.40 eV for the n-type Si substrate 1 and 0.65 eV for the p-type Si substrate 1. Considering the fact that the sum of these two values 0.40 and 0.65 of the electric potential barrier is approximately equal to 1.1 eV of the energy-band gap of Si, it was confirmed that the height of the electric potential barrier is distributed approximately uniformly.

Compared with the fact that the NiSi$_2$/Si(n-type) interface has a typical height of the electric potential barrier of approximately 0.7 eV, the height (=0.4 eV) of the electric potential barrier of the NiSi$_2$/Si(n-type) interface in the second embodiment is extremely low. This means that an Ohmic contact with the n-type Si substrate 1, which has an extremely low electric resistance, is able to be realized.

With the fabrication method of a semiconductor device according to the second embodiment, as described above, after the SiN film 2 is formed on the main surface 1a of the Si substrate 1 in the contact hole 16 of the dielectric film 7, the Ni film 9 is formed on the SiON film 8 of the dielectric film 7 to be contacted with the SiN film 2 in the contact hole 16. The Ni film 9 has a property that an atom of the Ni film 9 serves as diffusion species in a solid-phase silicidation reaction.

Subsequently, the NiSi$_2$ film 10 is formed by a heat treatment process due to a solid-phase silicidation reaction between the Ni film 9 and the Si substrate 1. The NiSi$_2$ film 10 thus formed is contacted with the main surface 1a of the Si substrate 1 in the contact hole 16. The SiN film 2 is left on the NiSi$_2$ film 10 thus formed.

Accordingly, the atoms of the Ni film 9 are able to be suppressed from diffusing at the start of the heat treatment step for silicidation reaction. Thus, a silicide phase with the highest free energy is generated after the heat-treatment temperature is completely raised to a specific value. Accordingly, the SiN film 5 is left on the NiSi$_2$ film 10 after the solid-phase silicidation reaction.

As a result, a semiconductor device having a reliable contact structure is fabricated even if a p-n junction has a small depth of 50 nm or less.

Also, the SiN film 5 thus left on the NiSi$_2$ film 10 serves as a barrier against the Al film 6 formed on the dielectric film 7 and consequently, this semiconductor device is fabricated by a simplified contact formation process even if a p-n junction has a small depth of 50 nm or less.

Third Embodiment

FIGS. 3A to 3F show a fabrication method of a semiconductor device according to a third embodiment, in which a contact structure including a cobalt silicide film is formed for a Metal-Oxide-Semiconductor Field-Effect Transistor (MOSFET).

Figure 3A:
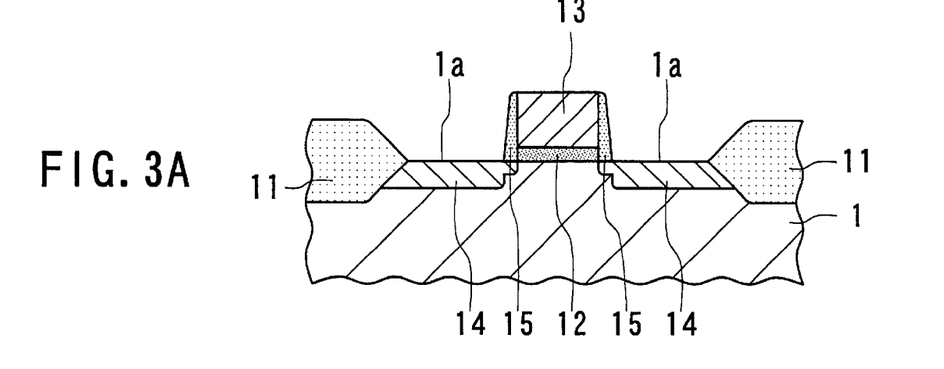
FIGS. 3A to 3F are partial cross-sections showing a fabrication method of a semiconductor device according to a third embodiment of the present invention, respectively.

First, as shown in FIG. 3A, an isolation oxide 11 is formed on a main surface 1a of a single-crystal Si substrate 1 and then, a gate oxide film 12 is formed on the main surface 1a by a thermal oxidation process. Next, a polysilicon film is deposited and patterned to form a gate electrode 13 on the gate oxide film 12. A pair of diffusion regions 14 are formed in the substrate 1 at each side of the polysilicon gate electrode 13 by a first ion-implantation process with a relatively low dose. An oxide film is deposited and anisotropically etched to thereby form a pair of sidewall spacers 15. The pair of diffusion regions 14 are subjected to a second ion-implantation process at a relatively high dose and subjected to a heat treatment. Thus, the pair of diffusion regions 14 having the Lightly-Doped Drain (LDD) structure are completed. The state at this stage is shown in FIG. 3A.

Figure 3B:
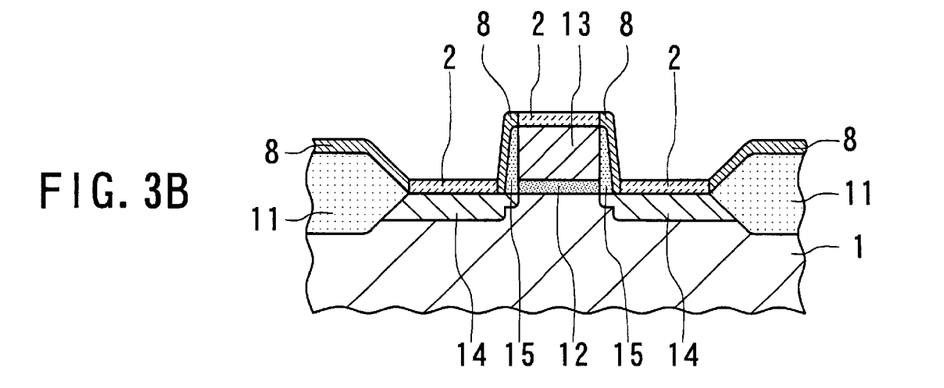

Subsequently, the native oxide on the exposed main surface 1a of the substrate 1 is removed by using a diluted hydrofluoric acid (HF). Then, the substrate 1 is transferred to a CVD chamber (not shown) and plasma is generated in an ammonia (NH$_3$) atmosphere while keeping the temperature of the substrate 1 at 300 ° C. Thus, the exposed main surface 1a of the substrate 1 is directly nitrided in the plasma, thereby forming a silicon nitride (SiN$_x$) film 2 with a thickness of approximately 1 nm on the exposed main surface 1a of the substrate 1, as shown in FIG. 3B. At this time, as shown in FIG. 3B, the surface regions of the isolation oxide 11 and the pair of sidewall spacers 15 also are nitrided, thereby forming a thin silicon oxynitride (SiON) film 8.

Figure 3C:
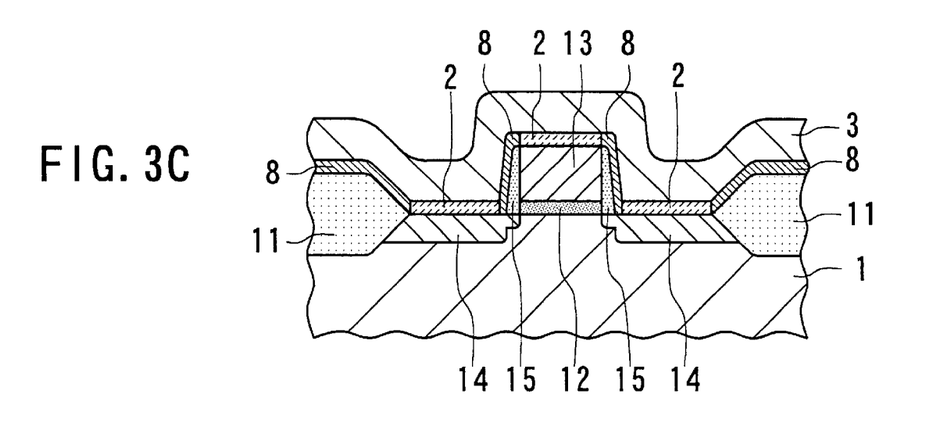

Subsequently, a Co film 3 with a thickness of 30 nm is deposited onto the SiN$_x$ film 2 and the SiON film 8 by a sputtering process, as shown in FIG. 3C.

Figure 3D:
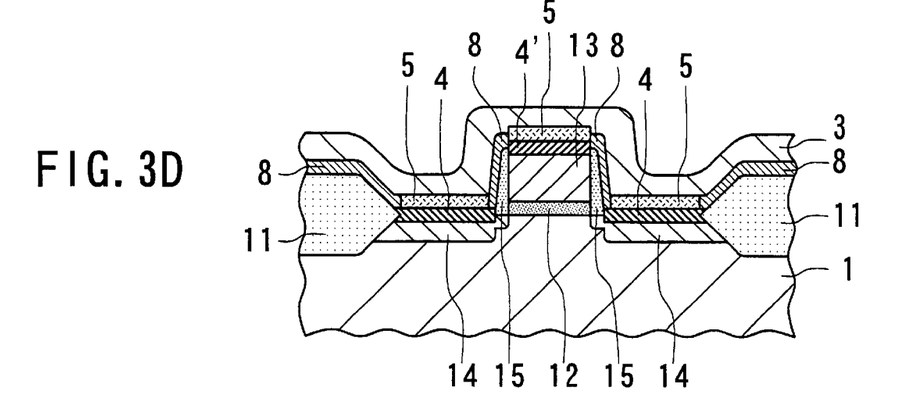

The substrate 1 with the structure shown in FIG. 3C is then subjected to a RTA process in an argon (Ar) atmosphere at 750° C. for 60 seconds. Thus, the Co film 3 is completely silicided to thereby form cobalt silicide (CoSi$_2$) films 4 and 4' with a uniform thickness of approximately 15 nm on the main surface 1a of the silicon substrate 1 and the polysilicon gate electrode 13, as shown in FIG. 3D.

The CoSi$_2$ film 4 on the main surface 1a of the substrate 1 has a single crystal structure. The CoSi$_2$ film 4' on the gate electrode 13 has a polycrystalline structure.

During this silicidation process, the cobalt (Co) atoms in the Co film 3 are diffused into the substrate 1. During this diffusion process of the Co atoms, the supplying rate of the Co atoms is suppressed by the SiN film 2. Therefore, the CoSi$_2$ film 4 has a stable crystal structure with the (100) orientation, which reflects the crystal orientation (100) of the main surface 1a of the Si substrate 1.

The interfaces of the CoSi$_2$ films 4 and the silicon substrate 1 is flat in the level of one or two atomic layers, and the thickness of the CoSi$_2$ film 4 is approximately uniform.

On the CoSi$_2$ films 4 and 4' thus formed, an amorphous film with a thickness of 1 to 2 nm is formed. This amorphous film is mainly made of silicon nitride. The unreacted Co film 3 is left on the amorphous SiN film 5 and on the SiON film 8 after the silicidation reaction, as shown in FIG. 3D.

Figure 3E:
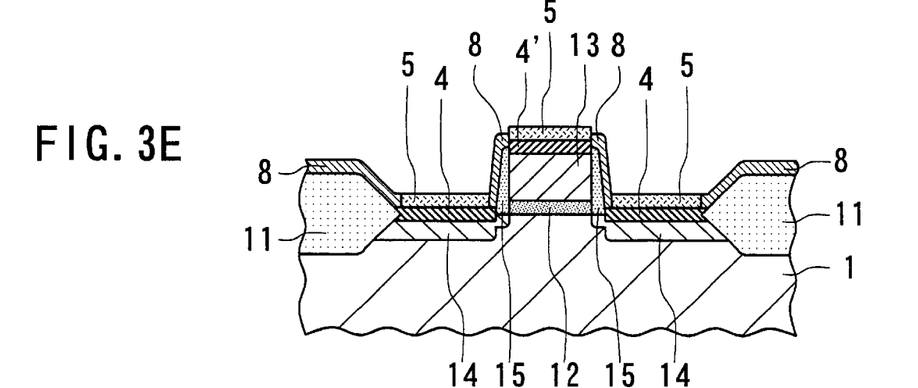

Following this heat-treatment process for silicidation reaction, the substrate 1 is subject to a wet etching process at 50° C. to remove the unreacted Co film 3 using a mixed solution of sulfuric acid (H$_2$SO$_4$), nitric acid (HNO$_3$), phosphoric acid (H$_3$PO$_4$), and acetic acid (CH$_3$COOH) of 1:1:4:4.

Thus, the combination of the CoSi$_2$ film 4 and the SiN film 5 is formed on the exposed surface 1a of the substrate 1, as shown in FIG. 3E.

Figure 3F:
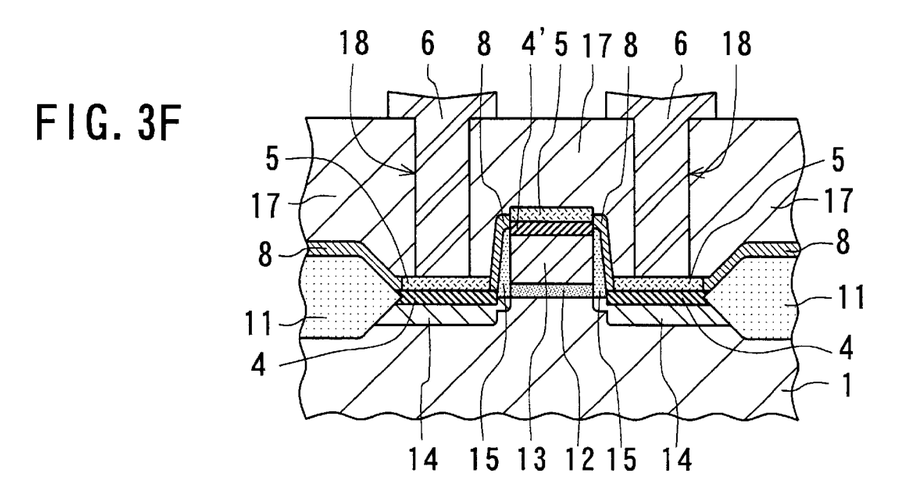

Further, a SiO$_2$ film 17 serving as an interlayer dielectric film is formed on the amorphous SiN film 5 and the SiON film 8, as shown in FIG. 3F. A pair of contact holes 18 are formed in the SiO$_2$ film 17 to extend to the underlying SiN film 5 by an etching process.

Finally, an Al film 6 with a thickness of 50 nm is deposited on the SiO$_2$ film 17 by sputtering and is patterned to be contact pads contacting with the amorphous SiN film 5 in the contact holes 18. Thus, the aluminum wiring film 6 is electrically connected to the pair of diffusion regions 14 in the substrate 1.

To evaluate the electric performance of the MOSFET thus fabricated, the inventors conducted the confirmation tests under the following conditions.

A chain with 2000 contact structures each having an area of 1×1 $\mu m^2$ was fabricated in the same way as that of the third embodiment, and the electric characteristics were measured. As a result, the average contact resistance of the contact pads was approximately equal to $1\times10^{-7}$ $\Omega\cdot cm^2$, which is satisfactorily low.

Further, the MOSFETs were subjected to heat treatment at 500° C. for 30 minutes in a hydrogen (H$_2$) atmosphere and then, the same measurement was conducted. As a result, the contact resistance was scarcely raised and no leakage current flowed.

In the third embodiment, Co is used as a metal for the silicidation reaction. However, any other metal such as Ni, V, Pt, and Pd, each of which serves as a diffusion species in the solid-phase silicidation reaction and has a low reactivity with a SiN film due to its low free energy for nitride formation, may be used instead of Co.

Also, the substrate 1 is subjected to an ammonia gas plasma in the heat treatment for nitridation in the third embodiment. However, the nitridation of the substrate 1 may be performed by exposing the substrate 1 to reactive nitrogen atoms. For example, the substrate 1 is exposed to an ammonia gas which has been activated by Electron Cyclotron Resonance (ECR) or is irradiated with a nitrogen gas beam.

Fourth Embodiment

Figure 4A:
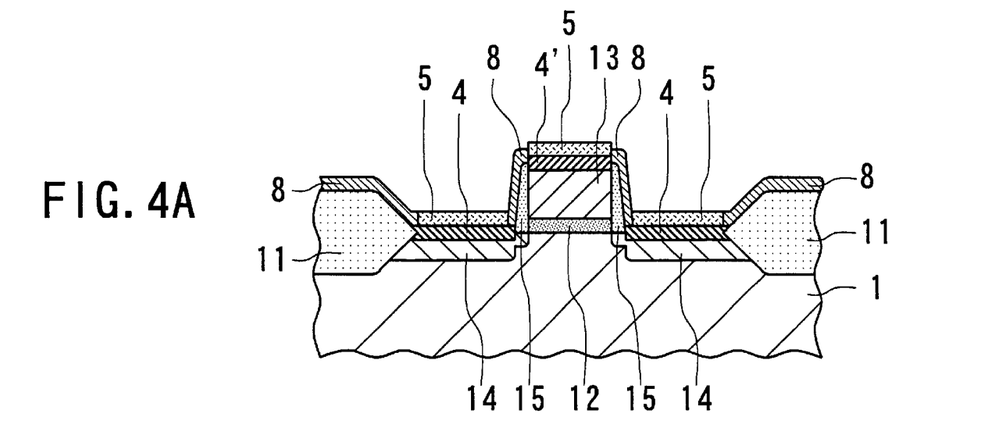
FIGS. 4A to 4C are partial cross-sections showing a fabrication method of a semiconductor device according to a fourth embodiment of the present invention, respectively.
Figure 4B:
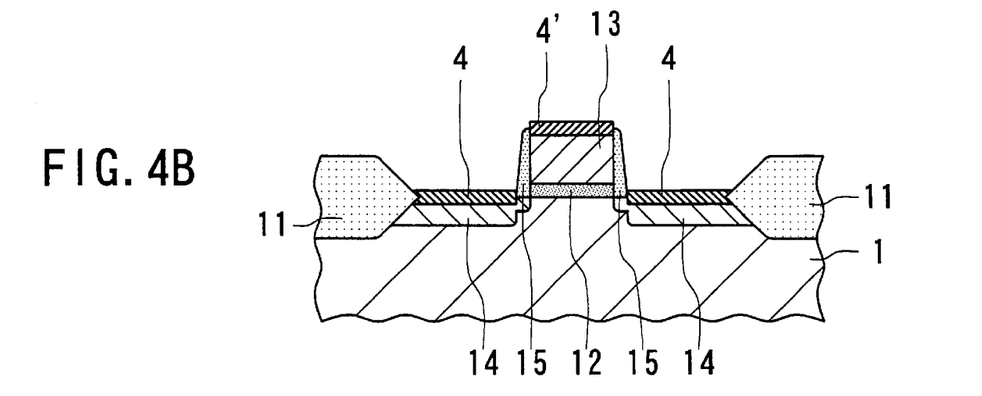
Figure 4C:
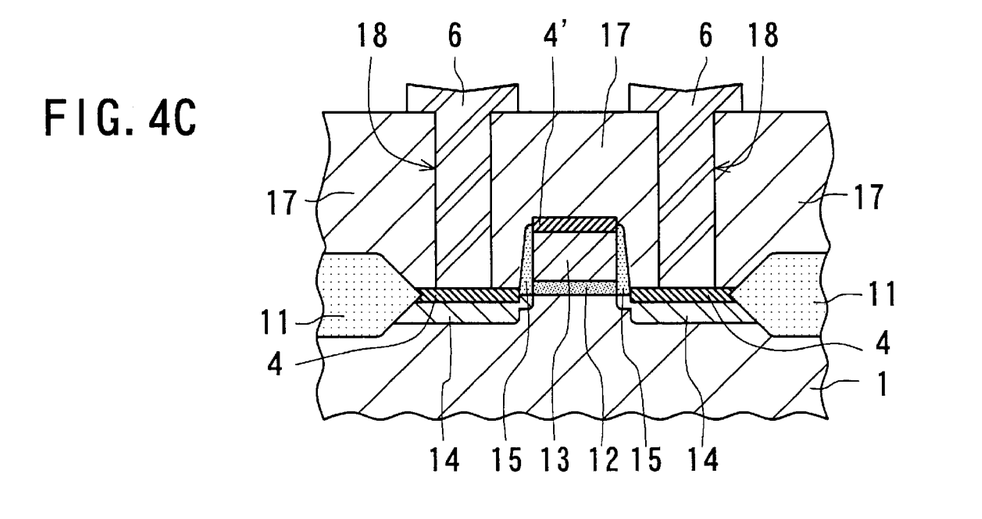

FIGS. 4A to 4C show a fabrication method of a semiconductor device according to a fourth embodiment, which includes the same process steps as those in the third embodiment except that the amorphous SiN film 5 is removed.

After the process step of FIG. 4A, which is the same as FIG. 3E, the amorphous SiN film 5 is removed by using a hot phosphoric acid (H$_3$PO$_4$). The state at this stage is shown in FIG. 4B.

Finally, the interlayer dielectric film 17 having the contact holes 6 is formed to cover the CoSi$_2$ films 4 and 4' and then, the Al film 6 is formed on the interlayer dielectric film 17 in the same way as that of the third embodiment. The state at this stage is shown in FIG. 4C.

With the method according to the fourth embodiment, there is an additional advantage that the contact resistance is further lowered compared with the third embodiment.

In the above embodiments, the NiSi$_2$ film 10 and the CoSi$_2$ film 4 are formed to be contacted with the single-crystal silicon substrate 1. However, it is needless to say that these films 10 and 4 may be formed to be contacted with an epitaxial layer on the single-crystal silicon substrate 1.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising the steps of:

(a) providing a single-crystal silicon substrate having a main surface;

(b) forming a dielectric film having a contact hole uncovering said main surface of said substrate on said main surface of said substrate;

(c) forming a silicon nitride film on said main surface of said substrate in said contact hole of said dielectric film;

(d) forming a metal film on said dielectric film to be contacted with said silicon nitride film in said contact hole of said dielectric film;

said metal film having a property that an atom of said metal film serves as diffusion species in a solid-phase silicidation reaction;

(e) heat-treating said metal film, said silicon nitride film, said dielectric film, and said substrate to thereby form a metal silicide film due to a solid-phase silicidation reaction between said metal film and said substrate;

said metal silicide film being contacted with said main surface of said substrate in said contact hole of said dielectric film;

said silicon nitride film being left on said metal silicide film;

(f) forming an electrically conductive film on said dielectric film to be contacted with said silicon nitride film; said electrically conductive film being electrically connected to said substrate through said silicon nitride film and said metal silicide film in said contact hole of said dielectric film.

2. The method as claimed in claim 1, wherein the silicon nitride film has a thickness of 0.5 to 1.5 nm.

3. The method as claimed in claim 1, wherein the silicon nitride film has a thickness of 0.5 to 1.0 nm.

4. The method as claimed in claim 1, wherein said metal silicide film is a silicide of a metal selected from the group consisting of cobalt (Co), nickel (Ni), vanadium (V), platinum (Pt), and palladium (Pd).

5. The method as claimed in claim 1, wherein said metal silicide film is a silicide of Co.

* * * * *